United States Patent [19]

Chiang

[11] Patent Number: 5,712,065
[45] Date of Patent: Jan. 27, 1998

[54] PROCESS FOR FABRICATING A MULTICOLOR FILTER

[75] Inventor: Jeen-Yuan Chiang, Taipei, Taiwan

[73] Assignee: Industrial Technology Research Institute, Hsinchu, Taiwan

[21] Appl. No.: 704,295

[22] Filed: Aug. 28, 1996

Related U.S. Application Data

[63] Continuation of Ser. No. 429,601, Apr. 27, 1995, abandoned.

[51] Int. Cl.$^6$ .................................................. G03F 9/00
[52] U.S. Cl. ............................ 430/7; 430/20; 430/24; 430/25; 430/312; 430/321; 430/327; 430/329
[58] Field of Search .................. 430/7, 20, 312, 430/321, 327, 329, 333, 24, 28, 25; 156/661.1

[56] References Cited

U.S. PATENT DOCUMENTS 5,009,972  4/1991  Higuchi et al. ...................... 430/20

FOREIGN PATENT DOCUMENTS 403252622  11/1991  Japan .

*Primary Examiner*—Thorl Chea
*Attorney, Agent, or Firm*—George O. Saile; Stephen B. Ackerman

[57] ABSTRACT

A process is described for the fabrication of a multicolor filter intended for use as part of a colored LCD system. A particular feature of the process is that no mask is needed for the formation of the final set of miniature color filters, thereby saving on mask costs as well as reducing processing time.

19 Claims, 4 Drawing Sheets

PROCESS FOR FABRICATING A MULTICOLOR FILTER

This is a continuation of the application Ser. No. 08/429,601, filed 27 Apr. 1995, now abandoned.

BACKGROUND OF THE INVENTION

(1) FIELD OF THE INVENTION

The invention relates to the area of multicolor light filters and to their use in colored liquid crystal displays.

(2) DESCRIPTION OF THE PRIOR ART

While displays based on liquid crystals (LCDs) have been widely available in monochrome for many years, color versions of this technology are still under active development. The problem is one of cost, rather than feasibility. At the present time colored LCDs are built out of monochrome LCDs whose illumination has been passed through a multicolor filter. The latter consists of a matrix of sub-pixel size dots on a common substrate, each dot being a tiny single color filter. The spatial locations of the different colored dots are known to the liquid crystal display system which controls the amount of light that is allowed to pass beyond any given dot, thereby creating a color image.

One of the ways in which multicolor filters are manufactured is by using a light sensitive resin (such as a methacrylate polymer) as the material out of which the aforementioned dots are formed. Such a resin can be made to serve as a light filtering medium by dispersing an appropriate pigment within it. Then, by using a mask when exposing such a resin to the appropriate actinic radiation, any desired pattern of dots of a given color can be produced.

Thus, the current process that is used to produce multicolor filters of this type involves a succession of exposures, each through a different mask, in order to create the desired pattern of different colored dots. Most commonly, three colors are used—red, green, and blue, so three different masks are needed. Masks of this type tend to be expensive and, furthermore, each time a mask is used in this type of application there is a danger of introducing contaminants. Any reduction in the number of masks that are needed to fabricate a multicolor filter will therefore bring about an appreciable reduction in the cost of this process.

SUMMARY OF THE INVENTION

It is a principal object of the present invention to reduce the cost of fabricating multicolor filters, particularly those associated with colored liquid crystal displays.

It is a further object of the present invention to reduce the number of masks needed to fabricate a given multicolor filter.

It is yet another object of the present invention to reduce the time needed to fabricate multicolor filters.

DESCRIPTION OF THE PREFERRED EMBODIMENTS

Color display based on LCD technology is achieved by passing light through a multicolor filter as well as the LCD. The former is a matrix of sub-pixel size dots arranged side by side on a common substrate, each dot being a tiny color filter. As already discussed, the spatial locations of the different colored dots are known to the LCD control system so, to achieve a given color image, light of the appropriate intensity is associated with each colored dot, as needed.

The process which we have developed for manufacturing such a multicolor filter will now be described. The starting point is a suitable substrate on which the filter will be deposited. Since a key feature of this process is that ultraviolet light (wavelength range 3,650 to 4,050 Angstrom units) will be passed through the substrate, it must be transparent to radiation in this wavelength range.

The first step is to deposit two orthogonal sets of parallel lines on the surface of the substrate thereby forming an open lattice-work of cells sometimes referred to as a black matrix. Dimensions of these cells is typically about 100×300 microns and the width of the lines that define them range from 0 to about 30 microns. The lines are generally created by standard techniques such as etching a previously deposited film of a metal such as chromium.

Figure 1:
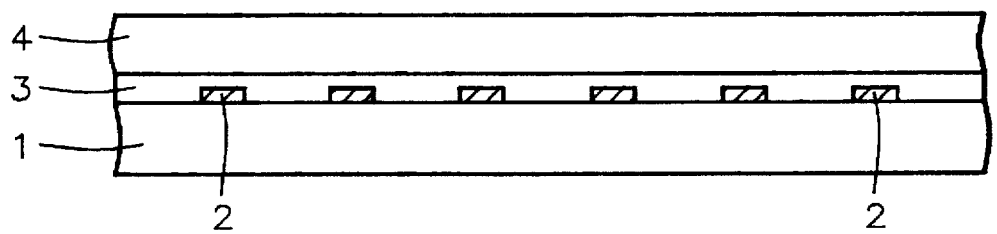
FIGS. 1 through 6 are a series of schematic cross-sectional views through a portion of a multicolor filter showing the process for fabricating it, as taught by the present invention.

A layer of color resin is now deposited over the black matrix. The appearance is as shown in FIG. 1 which is a cross-sectional view of a portion of substrate 1 on which black matrix 2 has been deposited. In addition to the layer of color resin 3 an oxygen barrier layer 4 is also shown. This layer, typically composed of polyvinyl alcohol (PVA), is not absolutely essential for the process to work, however we have found that, in its presence, the color resin is more sensitive to ultraviolet light, thereby allowing a reduction in the intensity of the latter when patterns are being formed. The importance of this will be further discussed later on.

The color resin itself is, in this example, a methacrylate resin of the type marketed by FUJI-HUNT Electronics (38th Kowa Bldg., 12–24, Nishiazabu 4-chome, Minato-ku, TOKYO 106, JAPAN). The color of the resin is determined by the choice of pigment that has been dispersed within it. For example, to obtain yellow, C.I. Pigment Yellow 139 is used. Application of the color resin to the substrate is by means of spin coating. First the viscosity of the unpolymerized resin is reduced by dissolving it in a suitable solvent. For example, at a concentration of between 5 and 15% in a mixture of cyclohexanone, methoxypropylacetate, and ethylene glycol. For further details on proportions, handling and safety, see the FUJI-HUNT Material Safety Data Source (MSDS File Number CM0002E). About 25 ml. of diluted resin solution applied to a substrate measuring 30×30 cm. and then spinning at about 650 rpm. results in a coating about 2 microns thick. For further details see FUJI-HUNT Photoresist Systems description of their Color Mosaic Standard Process.

Figure 2:
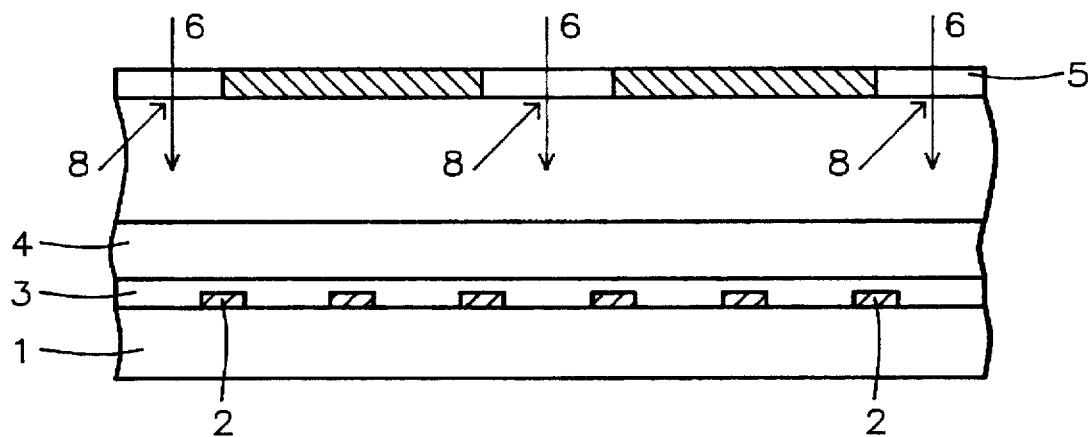
Figure 3:
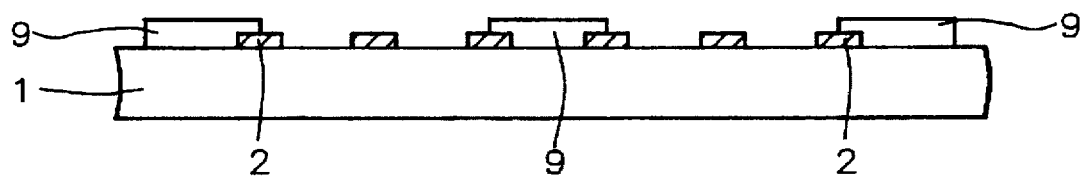

Once the deposited resin coating has been dried by baking (7090–90° C. for 1–3 minutes on a hot plate), as shown in FIG. 2 it is exposed to a beam of ultraviolet light 6 directed through a mask 5. The transparent areas 8 of the mask correspond to a subset of the cells in the above mentioned black matrix. In general, if N colors are to be used, 1/N of cells will be exposed to the ultraviolet light at any given time. Duration of exposure, expressed as ultraviolet dose, recommended by Fuji-Hunt is 10–30 millijoules (mj)/sq. cm. However, as will be discussed later on, a more restricted range of doses is needed at the final stage. After a brief wash in deionized water, the coating is then developed using the standard developer (marketed by Fuji-Hunt), diluted by adding it to water to a concentration between 10 and 20%. After development, only the parts of the color resin that were exposed to ultraviolet light remain on the substrate. This is illustrated in FIG. 3 where the remaining areas of color resin correspond to the areas that were immediately below the transparent portions 8 of mask 5 (in FIG. 2).

Figure 4:
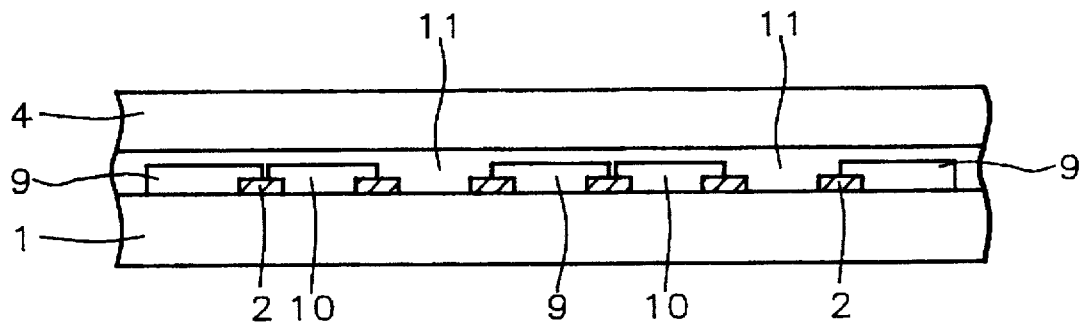
Figure 5:
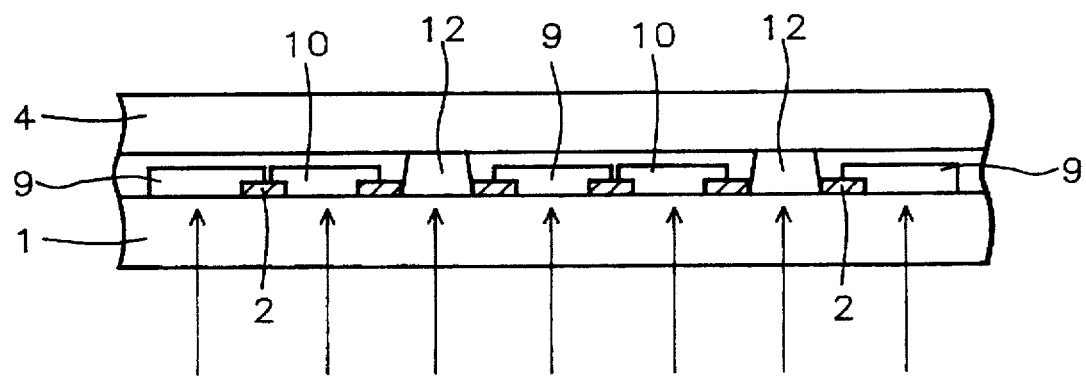

The above-described process (from resin application through development) may now be repeated, once for each color that is to be used, except for the final layer of color resin for which we use the following process: After the final coating of color resin has been applied, the appearance is as in FIG. 4. Two previously developed areas of color resin, 9 and 10, are shown, the remaining space under oxygen barrier 4 being occupied by the final layer of color resin 11. Now, instead of using a mask, ultraviolet light 13 is directed over the entire substrate area but enters through the bottom of the substrate. As illustrated in FIG. 5, the black matrix 2 acts as its own mask and developed areas of the final color resin 12 are automatically located within the remaining empty cells.

Figure 6:
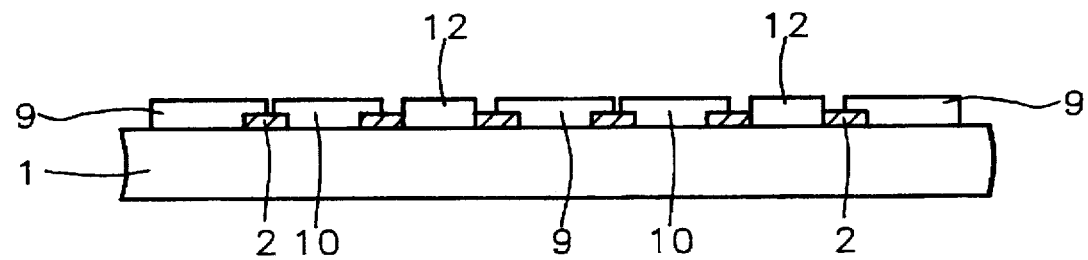

After development, in the manner described earlier, the appearance of the structure is as illustrated in FIG. 6. In this example, three different colors were used (shown as 9, 10, and 12 in the ), but the method is not restricted to this number.

Once all the desired layers of color resin have been deposited, a colorless layer of resin, about 4,000 Angstrom units thick, is added to the final product for levelling purposes. This is followed by the deposition, through sputtering, of an Indium-tin oxide (ITO) film onto the levelled surface, with a silane coupling agent being used as an intermediate layer between resin and ITO to enhance adhesion. The ITO film serves to protect the structure from attack by extraneous chemicals during its lifetime. "For the full display, a layer of liquid crystal (not shown) is provided in close proximity to the front side of the structure illustrated in FIG. 6."

The advantages of using self-masked backside illumination for the final layer of color resin are:

no time is expended in mask alignment the cost of one mask is saved possible particle contamination (introduced by the mask) is eliminated.

the edges of the dots have less taper than those created by exposure through a mask The main disadvantage of backside illumination is that control of exposure time (ultraviolet dose) becomes more critical. In particular, over-exposure has more serious consequences than if a mask is used. This is because, as illustrated in FIG. 4, a portion of final color resin layer 11 will, of necessity, reside in the regions immediately above the previously developed layers 9 and 10. It is essential that these portions of the layer 11 be removed during development since they are the wrong color for those particular cells. For moderate ultraviolet doses, in combination with the lower intensity source made possible by the use of an oxygen barrier, the previously developed portions of color resin 9 and 10 will serve to attenuate the ultraviolet to a sufficient degree to prevent its interacting with that part of layer 11 that lies above them. If, however, the ultraviolet dose is too high, this will not happen and these portions of layer 11 will interact with the ultraviolet light and consequently be left behind after development.

Figure 7:
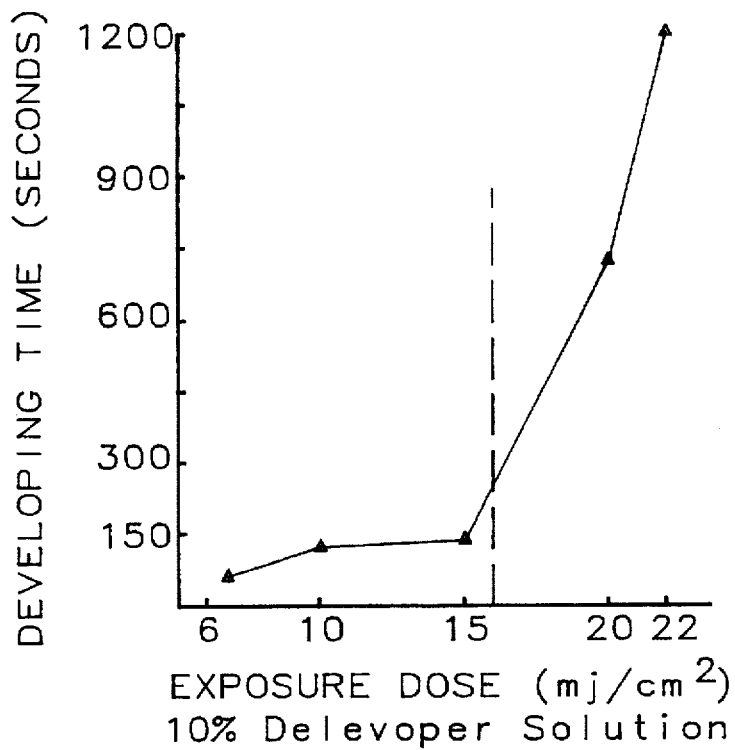
FIGS. 7 and 8 are curves, for two different developer strengths, showing the relationship between development time and ultraviolet exposure dose for a methacrylate resin.
Figure 8:
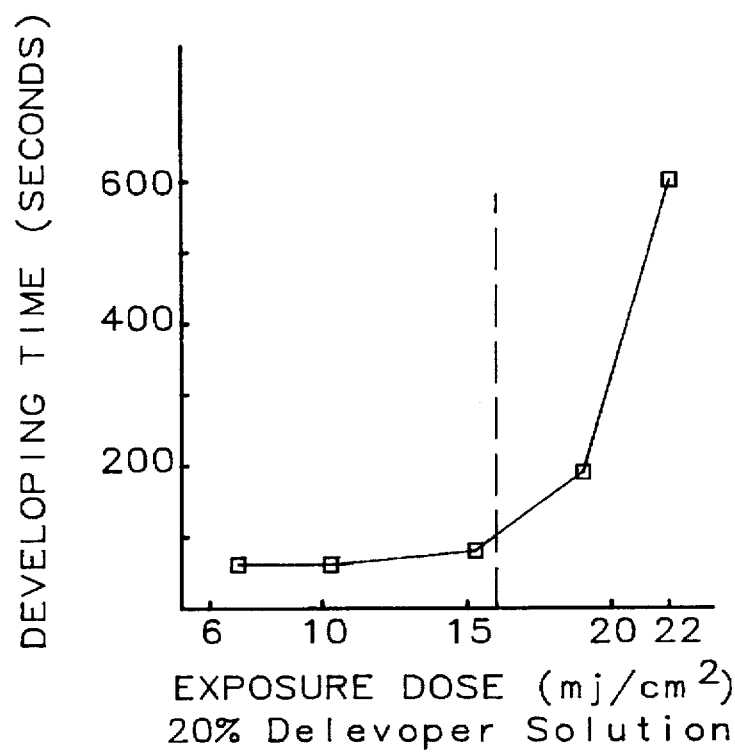

We have found that the best ultraviolet dose to use in order to eliminate the problems discussed immediately above is between 6 and 16 mj/sq. cm., although doses as high as 21 mj/sq. cm. have been used with limited success. One way in which the penetration of the ultraviolet radiation through the previously developed layers manifests itself is in the increase in the time required to fully develop the resin after exposure to ultraviolet. Curves of development time vs. exposure dose are shown in FIGS. 7 and 8 for two strengths of developer solution, namely 10% and 20% respectively. As can be seen, development time rises steeply for doses that exceed the 16 mj/sq. cm. limit (marked by a dotted line in each figure).

Figure 9:
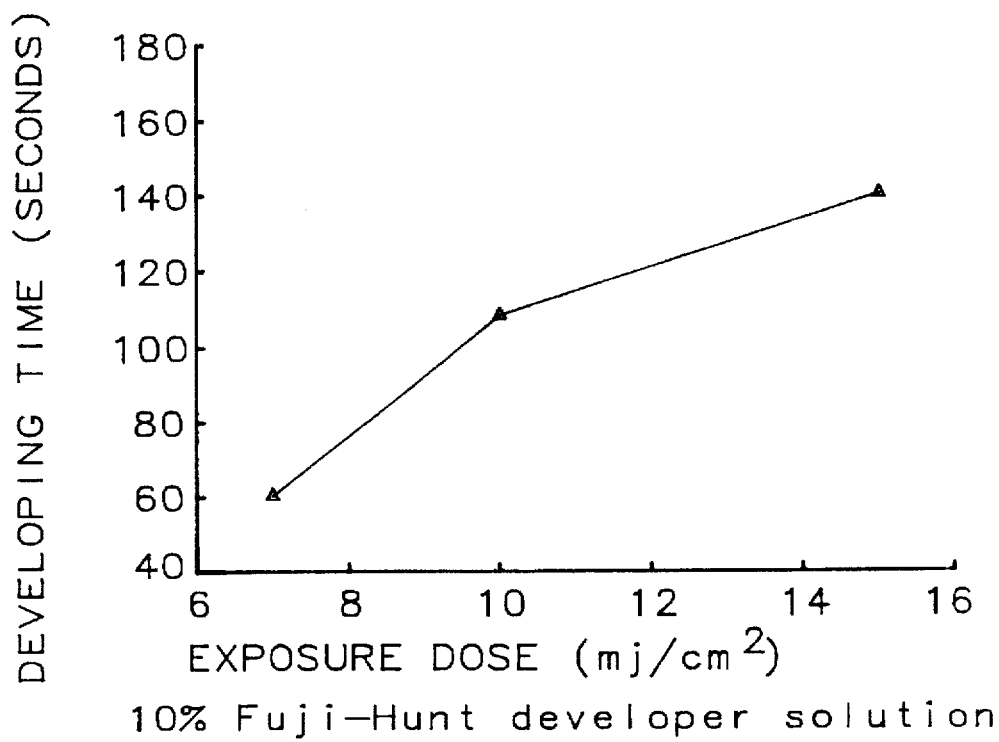
FIGS. 9 and 10 are curves, showing, in greater detail, a subset of the data presented in FIGS. 7 and 8 respectively.
Figure 10:
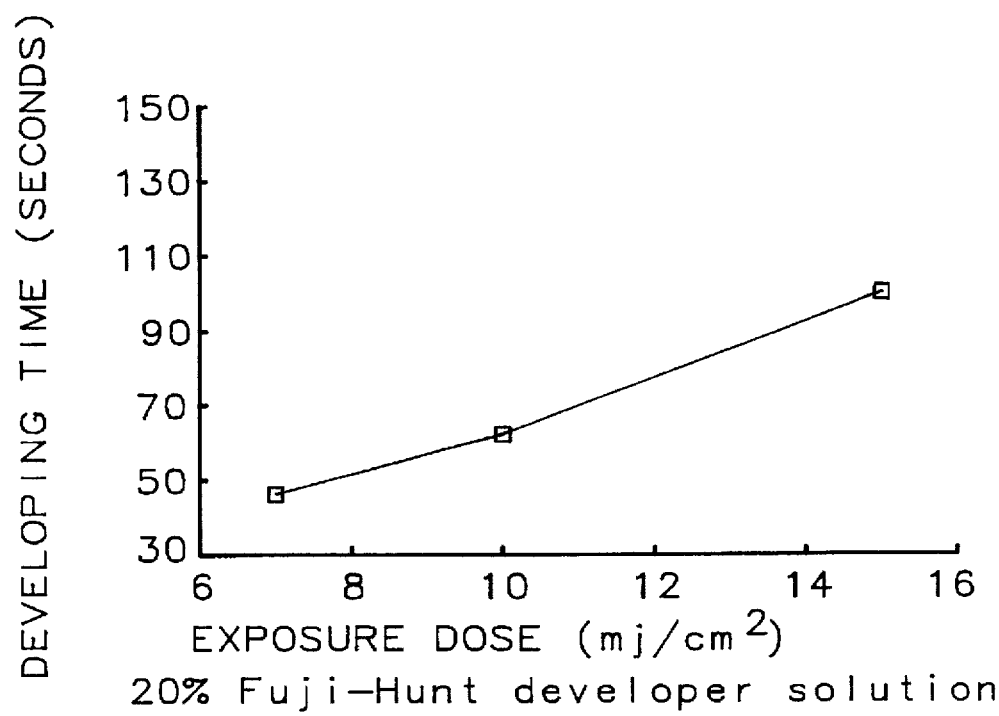

It was found that samples whose ultraviolet dose was to the right of the dotted line in FIGS. 7 or 8 failed, either because of unacceptably high levels of particle contamination or because some of the colors were wrong, or both. In FIGS. 9 and 10 we show more detailed versions of the data contained to the left of the dotted lines in FIGS. 7 and 8 respectively.

While the invention has been particularly shown and described with reference to the preferred embodiments thereof, it will be understood by those skilled in the art that various changes in form and details may be made without departing from the spirit and scope of the invention.

What is claimed is:

1. A process for fabricating a multicolor filter comprising:
   (a) providing a substrate, having a front side and a back side, that is transparent to ultraviolet light;
   (b) creating a black matrix by depositing opaque intersecting lines on said front side;
   (c) coating said front side with a first layer of photosensitive material in which pigment of a first color has been dispersed, exposing said coated front side to ultraviolet light directed through a mask positioned above said front side and developing said first layer of exposed photosensitive material thereby removing all photosensitive material that was not exposed to ultraviolet light;
   (d) coating said front side with a second layer of photosensitive material in which pigment of a second color has been dispersed, exposing said coated front side to ultraviolet light directed through a mask positioned above said front side and developing said second layer of exposed photosensitive material thereby removing all photosensitive material that was not exposed to ultraviolet light; and
   (e) coating said front side with a third layer of photosensitive material in which pigment of a third color has been dispersed, exposing said coated front side to ultraviolet light directed through said back side of the substrate using said black matrix as mask.

2. The process as recited in claim 1 wherein the substrate is transparent to ultraviolet light having a wavelength between 3,650 and 4,050 Angstrom units.

3. The process as recited in claim 1 wherein the dose of ultraviolet light that is applied through a mask is between 10 and 16 millijoules/sq. cm.

4. The process as recited in claim 1 wherein the dose of ultra-violet light that is applied through the back side of the substrate is between 10 and 16 millijoules/sq. cm.

5. The process as recited in claim 1 wherein the thickness of said layer of photosensitive material is between 0.8 and 2 microns.

6. The process as recited in claim 1 wherein said photosensitive material comprises a methacrylate polymer resin.

7. The process as recited in claim 1 wherein said photosensitive material is deposited by means of spin coating.

8. A process for making a colored liquid crystal display comprising:

fabricating a multicolor filter according to the process recited in claim 1; and providing a layer of liquid crystal in close proximity to the front side of said multicolor filter.

9. A process for fabricating a multicolor filter comprising:

(a) providing a substrate, having a front side and a back side, that is transparent to ultraviolet light;

(b) creating a black matrix by depositing opaque intersecting lines on said front side;

(c) coating said front side with a first layer of photosensitive material in which pigment of a first color has been dispersed, coating the first layer of photosensitive material with a layer of polyvinyl alcohol for the purpose of providing an oxygen barrier, exposing said coated front side to a dose of ultraviolet light between 10 and 16 millijoules per sq. cm., directed through a mask positioned above said front side and removing said oxygen barrier and then developing said first layer of exposed photosensitive material thereby removing all photosensitive material that was not exposed to ultraviolet light;

(d) coating said front side with a second layer of photosensitive material in which pigment of a second color has been dispersed, coating the second layer of photosensitive material with a layer of polyvinyl alcohol for the purpose of providing an oxygen barrier, exposing said coated front side to a dose of ultraviolet light between 10 and 16 millijoules per sq. cm., directed through a mask positioned above said front side and removing said oxygen barrier and then developing said second layer of exposed photosensitive material thereby removing all photosensitive material that was not exposed to ultraviolet light; and (e) coating said front side with a third, and final, layer of photosensitive material in which pigment of a third color has been dispersed, coating the third layer of photosensitive material with a layer of polyvinyl alcohol for the purpose of providing an oxygen barrier, exposing said coated front side to a dose of ultraviolet light between 10 and 16 millijoules per sq. cm., directed through said back side of the substrate using said black matrix as mask, and removing said oxygen barrier and then developing said third layer of exposed photosensitive material thereby removing all photosensitive material that was not exposed to ultraviolet light.

10. The process as recited in claim 9 wherein the substrate is transparent to ultraviolet light having a wavelength between 3,650 and 4,050 Angstrom units.

11. The process as recited in claim 9 wherein the thickness of said layer of photosensitive material is between 0.8 and 2 microns.

12. The process as recited in claim 9 wherein said photosensitive material comprises a methacrylate polymer resin.

13. The process as recited in claim 9 wherein said photosensitive material is deposited by means of spin coating.

14. A process for making a colored liquid crystal display comprising:

fabricating a multicolor filter according to the process recited in claim 9; and providing a layer of liquid crystal in close proximity to the front side of said multicolor filter.

15. A process for fabricating a multicolor filter comprising:

(a) providing a substrate, having a front side and a back side, that is transparent to ultraviolet light;

(b) creating a black matrix by depositing opaque intersecting lines on said front side;

(c) coating said front side with a first layer of a methacrylate resin in which pigment of a first color has been dispersed, coating the first layer of methacrylate resin with a layer of polyvinyl alcohol for the purpose of providing an oxygen barrier, exposing said coated front side to a dose of ultraviolet light between 10 and 16 millijoules per sq. cm. directed through a mask positioned above said front side and removing said oxygen barrier and then developing said first layer of exposed methacrylate resin thereby removing all methacrylate resin that was not exposed to ultraviolet light;

(d) coating said front side with a second layer of a methacrylate resin in which pigment of a second color has been dispersed, coating the second layer of methacrylate resin with a layer of polyvinyl alcohol for the purpose of providing an oxygen barrier, exposing said coated front side to a dose of ultraviolet light between 10 and 16 millijoules per sq. cm., directed through a mask positioned above said front side and removing said oxygen barrier and then developing said second layer of exposed methacrylate resin thereby removing all methacrylate resin that was not exposed to ultraviolet light; and (e) coating said front side with a third, and final, layer of a methacrylate resin in which pigment of a third color has been dispersed, coating the third layer of methacrylate resin with a layer of polyvinyl alcohol for the purpose of providing an oxygen barrier, exposing said coated front side to a dose of ultraviolet light between 10 and 16 millijoules per sq. cm., directed through said back side of the substrate using said black matrix as mask, and removing said oxygen barrier and then developing said third layer of exposed methacrylate resin thereby removing all methacrylate resin that was not exposed to ultraviolet light.

16. The process as recited in claim 15 wherein the substrate is transparent to ultraviolet light having a wavelength between 3,650 and 4,050 Angstrom units.

17. The process as recited in claim 15 wherein the thickness of said layer of methacrylate resin is between 0.8 and 2 microns.

18. The process as recited in claim 15 wherein said methacrylate resin is deposited by means of spin coating.

19. A process for making a colored liquid crystal display comprising:

fabricating a multicolor filter according to the purpose recited in claim 15; and providing a layer of liquid crystal in close proximity to the front side of said multicolor filter.

* * * * *